United States Patent
Kamp et al.

(10) Patent No.: US 6,921,724 B2
(45) Date of Patent: Jul. 26, 2005

(54) VARIABLE TEMPERATURE PROCESSES FOR TUNABLE ELECTROSTATIC CHUCK

(75) Inventors: Tom A. Kamp, San Jose, CA (US); Richard Gottscho, Pleasanton, CA (US); Steve Lee, Fremont, CA (US); Chris Lee, Oakland, CA (US); Yoko Yamaguchi, Fremont, CA (US); Vahid Vahedi, Albany, CA (US); Aaron Eppler, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 224 days.

(21) Appl. No.: 10/235,453

(22) Filed: Sep. 4, 2002

(65) Prior Publication Data

US 2003/0186545 A1 Oct. 2, 2003

Related U.S. Application Data

(60) Provisional application No. 60/369,773, filed on Apr. 2, 2002.

(51) Int. Cl.$^7$ .......................................... H01L 21/302
(52) U.S. Cl. .................. 438/715; 438/714; 156/345.52; 156/345.53
(58) Field of Search ................................ 438/706, 710, 438/713, 714, 715; 156/345.51, 345.52, 345.53, 345.27

(56) References Cited

U.S. PATENT DOCUMENTS

| | | | | |
|---|---|---|---|---|
| 4,971,653 A | * | 11/1990 | Powell et al. | 438/5 |
| 5,935,874 A | * | 8/1999 | Kennard | 438/710 |
| 5,989,929 A | | 11/1999 | Nikoh et al. | 438/9 |
| 6,221,205 B1 | * | 4/2001 | Blalock et al. | 156/345.27 |
| 6,320,737 B1 | * | 11/2001 | Hirano et al. | 361/234 |
| 6,387,798 B1 | * | 5/2002 | Loke et al. | 438/623 |
| 6,508,885 B1 | * | 1/2003 | Moslehi et al. | 118/728 |

* cited by examiner

Primary Examiner—Lan Vinh
(74) Attorney, Agent, or Firm—Thelen, Reid & Priest LLP; Thierry K. Lo (57) ABSTRACT

An etch processor for etching a wafer includes a chuck for holding the wafer and a temperature sensor reporting a temperature of the wafer. The chuck includes a heater controlled by a temperature control system. The temperature sensor is operatively coupled to the temperature control system to maintain the temperature of the chuck at a selectable setpoint temperature. A first setpoint temperature and a second setpoint temperature are selected. The wafer is placed on the chuck and set to the first setpoint temperature. The wafer is then processed for a first period of time at the first setpoint temperature and for a second period of time at the second setpoint temperature.

26 Claims, 7 Drawing Sheets

VARIABLE TEMPERATURE PROCESSES FOR TUNABLE ELECTROSTATIC CHUCK

CROSS-REFERENCES

The present application claims the benefit of U.S. Provisional Patent Application Ser. No. 60/369,773, filed Apr. 2, 2002 in the name of inventors Tom Kamp, Richard A. Gottscho, Steve Lee, Chris Lee, Yoko Yamaguchi, Vahid Vahedi, Aaron Eppler, commonly assigned herewith.

FIELD OF THE INVENTION

The present invention relates to semiconductor manufacturing. More particularly, the present invention relates to plasma etching and deposition.

BACKGROUND OF THE INVENTION

In manufacturing integrated circuits, semiconductor wafers may be completely coated with one or more layers of materials such as silicon dioxide, silicon nitride, or a metal. The unwanted material is then selectively removed using one or more etching processes, for example, by etching through a mask. Sometimes various patterns are etched directly onto the semiconductor surface. For example, circular holes or grooves may be made where trench capacitors are to be formed. Most integrated circuit etching removes material in selected regions only and is carried out using a series of related processing steps. First, a semiconductor wafer is coated with an adherent and etch-resistant photoresist. The photoresist is then selectively removed to leave a desired pattern. Etching is then carried out to transfer the mask pattern to the underlying material. The photoresist is then removed (stripped) and the wafer is cleaned.

Possible kinds of etching include wet chemical, electrochemical, plasma etching, reactive ion etching, ion beam milling, sputtering, and high-temperature vapor etching. Plasma etching is now commonly used in fine-geometry applications such as the fabrication of semiconductor memory devices. As the integration density of semiconductor integrated circuits increases, it will be desirable to improve the controllability of such etching processes for forming specific shapes of etched features such as deep trenches, contact holes, and openings on a semiconductor wafer.

BRIEF DESCRIPTION OF THE INVENTION

An etch processor for etching a wafer includes a chuck for holding the wafer and a temperature sensor reporting a temperature of the wafer. The chuck includes a heater controlled by a temperature control system. The temperature sensor is operatively coupled to the temperature control system to maintain the temperature of the chuck at a selectable setpoint temperature. A first setpoint temperature and a second setpoint temperature are selected. The wafer is placed on the chuck and set to the first setpoint temperature. The wafer is then processed for a first period of time at the first setpoint temperature and for a second period of time at the second setpoint temperature.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of variable temperature processes for tunable electrostatic chuck. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In semiconductor manufacturing, it is prevalent to employ stacks of thin films. For example, a typical transistor gate stack used for DRAM fabrication may consist of: Si/gate oxide/poly-Si/silicide/hard-mask/ARC, where silicide is typically $WSi_x$, ARC can be organic or inorganic ($SiON_x$), and hard-mask can be an oxide, nitride, or oxynitride of Si. Another such stack might be: Si/gate dielectric/poly-Si/WN/ W/hard-mask/ARC, where gate dielectric might be $SiO_2$, nitridized $SiO_2$, or any one of many new so-called high-k materials such as $HfO_2$, $ZrO_2$, or $Al_2O_3$. In many cases, it is common to use a photoresist mask instead of or in addition to (on top of) the ARC layer. Sometimes the ARC layer is removed when the hard mask is defined using a photoresist mask. There is a large number of variations on these stacks for gate definition alone. Similarly large variations are found in defining trenches for isolation, storage, and interconnection and in defining contacts and vias for interconnection of one layer to another.

In etching such complex stacks, it is important to etch materials selectively and to maintain tightly prescribed profiles or shapes throughout the stack. For example, in gate etching, it is typical for the stack specification to be vertical or 90 degree's with high selectivity to the gate dielectric so that it is neither damaged nor etched. In shallow trench etching, the trench side-wall angle must be carefully controlled. The trench sidewall angle could typically differ from vertical by as much as 10–15 degrees. Moreover, in shallow trench etching, the shape of the top and bottom of the trench may be a critical device parameter—so-called top and bottom corner rounding. In many device designs, the poly-Si might be dual-doped, i.e. there may be regions within a chip where n-doped poly-Si is used and other regions where p-doped poly-Si is used. In such cases, it is important to maintain constant etch rate and profile for both types of doped poly-Si. Another variation within chip is the line density: some regions have lines that are densely spaced and other regions where lines are more isolated. Again, it is important that etch rates and profiles be as identical as possible between dense and isolated regions of the chip.

In etching thin films for semiconductor device fabrication, it is common to encounter large variations in area of the masking material—be it hard or soft mask. Such variations result in alteration of the etched film properties such as profile angle, selectivity to underlying material, and within wafer uniformity. It is common to compensate for changes in open area by changing recipe parameters such as the composition of the gas, total flow rate, rf power, etc.

Figure 1:
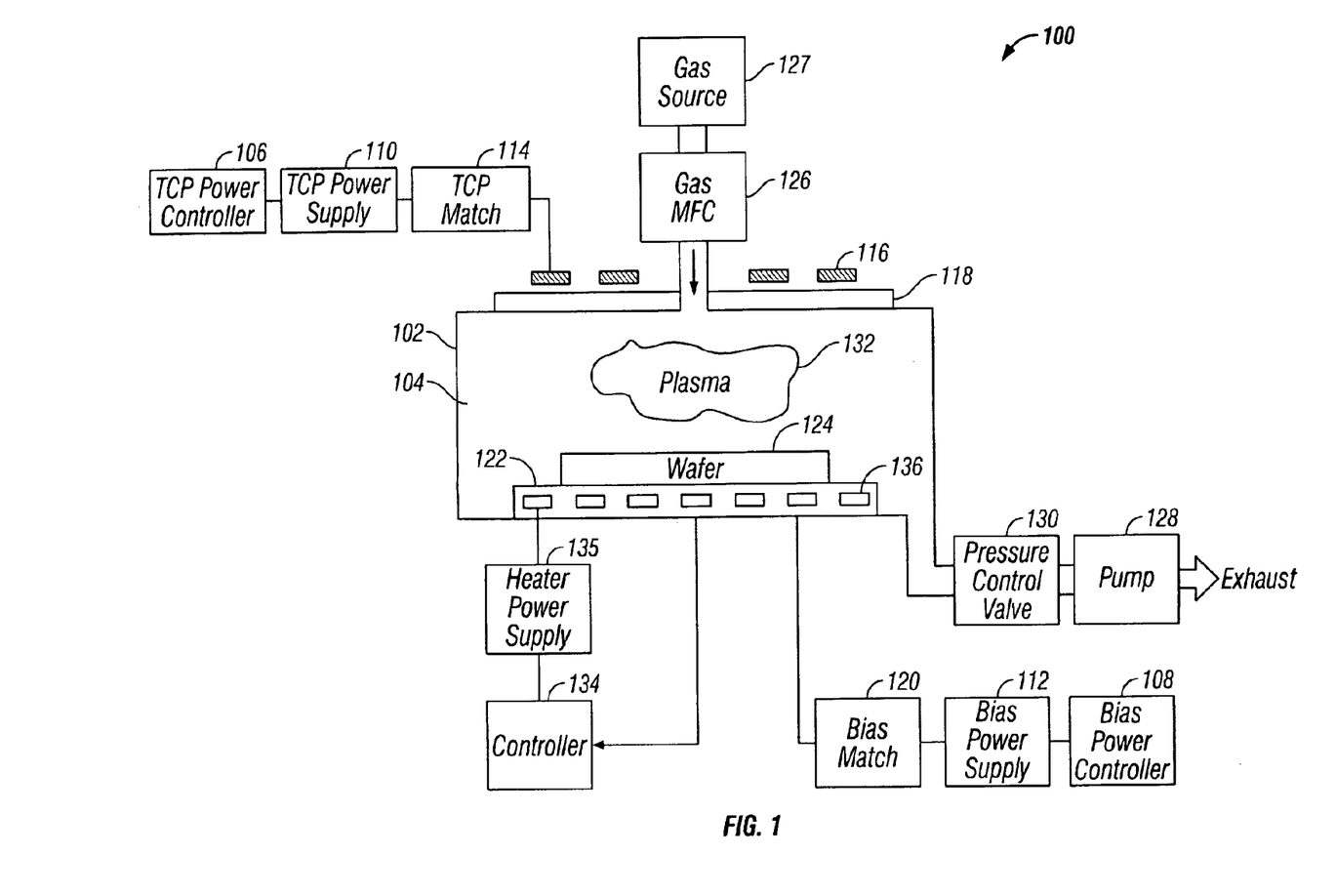
FIG. 1 is a block diagram of an etching apparatus used to carry out the etching method according to one specific embodiment of the present invention.
Figure 2:
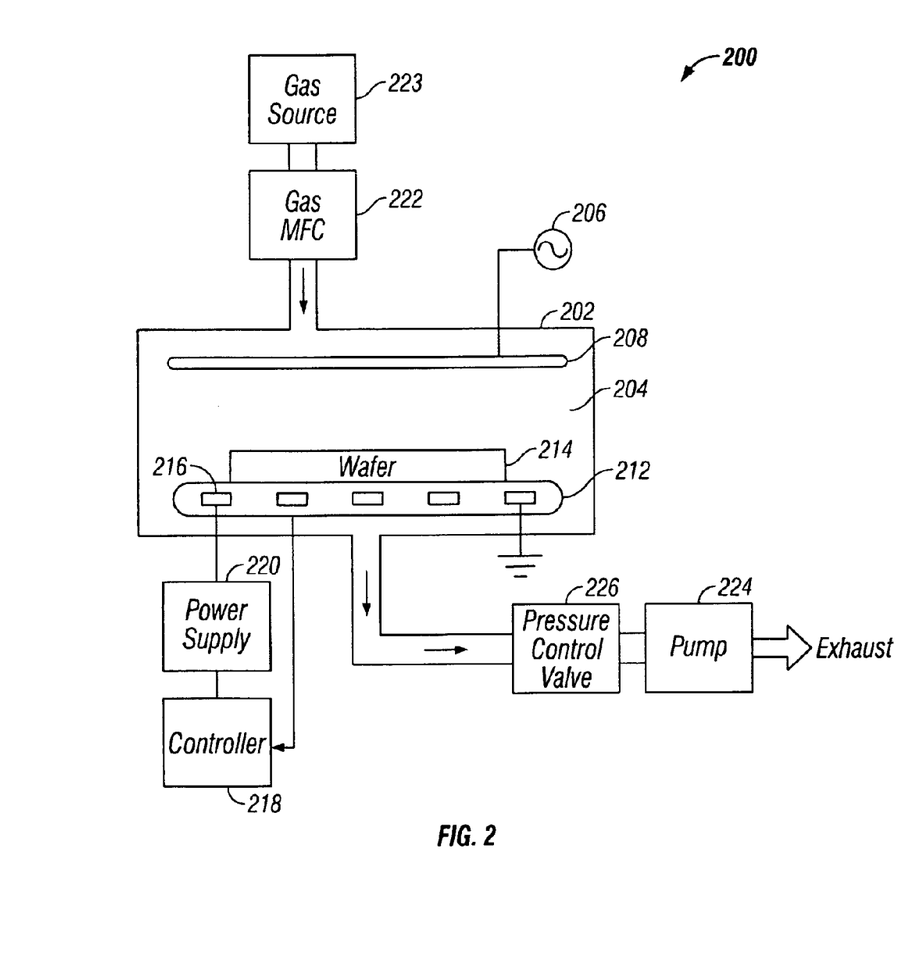
FIG. 2 is a block diagram of an etching apparatus used to carry out the etching method according to another specific embodiment of the present invention.

In each of the cases described above, the wafer temperature is an important recipe parameter. Etching and deposition rates are temperature dependent but these temperature dependencies are not all the same. Hence, it is possible, to minimize iso-dense profile and etch rate differences by adjusting the overall wafer temperature. Similarly, open area dependencies, selectivity of one film to another, and doping dependencies can be compensated by changing the overall wafer temperature. In accordance with one specific embodiment of the present invention, a method for controlling a profile of a wafer is by varying the wafer temperature step-by-step during the etching of complex stacks to optimize profile, critical dimension, and selectivity. To make such temperature variation practical, a fast-response wafer substrate holder, for example, an electrostatic chuck, may be used to avoid degradation of overall throughput. In accordance with one embodiment, the temperature may not be at steady-state but processing while the temperature ramps from one state to another will result in a similar benefit. The wafer temperature can be controlled by any means used to change temperature within a short time scale relative to the etch time. One example is control of helium pressure between the wafer being processed and an electrostatic chuck (ESC). Another is to have heaters in the ESC itself and actively control the temperature of the wafer with the heaters. The process of the temperature control of the wafer is explained in more detail below. FIGS. 1 and 2 illustrates two examples of etching apparatus used to carry out the etching process in accordance with one specific embodiment of the present invention.

FIG. 1 is a block diagram of an etching apparatus used to carry out the etching method according to one specific embodiment of the present invention. The illustrated inductively coupled plasma etching system 100 may be used in the processing and fabrication of semiconductor devices. The inductively coupled plasma processing system 100 includes a plasma reactor 102 having a plasma chamber 104 therein. A transformer coupled power (TCP) controller 106 and a bias power controller 108 respectively control a TCP power supply 110 and a bias power supply 112 influencing the plasma created within plasma chamber 104.

The TCP power controller 106 sets a set point for TCP power supply 110 configured to supply a radio frequency (RF) signal, tuned by a TCP match network 114, to a TCP coil 116 located near plasma chamber 104. An RF transparent window 118 is typically provided to separate TCP coil 116 from plasma chamber 104 while allowing energy to pass from TCP coil 116 to plasma chamber 104.

The bias power controller 108 sets a set point for bias power supply 112 configured to supply a RF signal, tuned by a bias match network 120, to an electrode 122 located within the plasma reactor 104 creating a direct current (DC) bias above electrode 122 which is adapted to receive a substrate 124, such as a semi-conductor wafer, being processed.

A gas supply mechanism 126, such as a manifold of mass flow controllers upstream, typically supplies from a gas source 127 the proper chemistry required for the manufacturing process to the interior of plasma reactor 104. An exhaust manifold 128 removes gas and some particulate matter from within plasma chamber 104. Pressure in the plasma chamber 104 is maintained by using a throttle valve 130, often of the pendulum type.

A temperature controller 134 controls the temperature of the chuck 122 by regulating the power to heaters 136 within the chuck 122 using the heater power supply 135. The characteristics of the heaters are discussed further below. FIG. 1 illustrates a closed-loop feedback-control control system for the heater.

In plasma chamber 104, substrate etching is achieved by exposing substrate 104 to ionized gas compounds (plasma) under vacuum. The etching process starts when the gases are conveyed into plasma chamber 104. The RF power delivered by TCP coil 116 and tuned by TCP match network 110 ionizes the gases. The RF power, delivered by electrode 122 and tuned by bias match network 120, induces a DC bias on substrate 124 to control the direction and energy of ion bombardment of substrate 124. During the etching process, the plasma reacts chemically with the surface of substrate 124 to remove material not covered by a photoresistive mask.

Input parameters such as plasma reactor settings are of fundamental importance in plasma processing. The amount of actual TCP power, bias power, gas pressure, gas temperature, and gas flow within plasma chamber 104 greatly affects the process conditions. Significant variance in actual power delivered to plasma chamber 104 may unexpectedly change the anticipated value of other process variable parameters such as neutral and ionized particle density, temperature, and etch rate.

FIG. 2 is a block diagram of an etching apparatus used to carry out the etching method according to another specific embodiment of the present invention. FIG. 2 illustrates a capacitively coupled plasma etching system 200 used in the processing and fabrication of semiconductor devices. The capacitively coupled plasma processing system 200 includes a plasma reactor 202 having a plasma chamber 204 therein. A variable power supply 206 is coupled to an upper electrode 208 influencing the plasma 210 created within plasma chamber 204.

A grounded lower electrode 212, or a chuck, supports a wafer 214 to be processed. In accordance with one specific embodiment of the present invention, the chuck includes one or more heaters 216 embedded within the chuck. A temperature controller 218 controls the temperature of the chuck 212 via a heater power supply 220 that is coupled to the heater 216. The characteristics of the heaters and the chuck are discussed further below.

A gas supply mechanism 222, such as a manifold of mass flow controllers upstream, typically supplies from a gas source 223, the proper chemistry required for the manufacturing process to the interior of plasma reactor 204. An exhaust manifold 224 removes gas and some particulate matter from within plasma chamber 204. Pressure in the plasma chamber 204 is maintained by using a throttle valve 226, often of the pendulum type.

In the plasma chamber 200, the etching of a substrate such as a wafer is achieved by exposing the wafer 214 to ionized gas compounds (plasma 210) under vacuum. The etching process starts when the gases are conveyed into plasma chamber 204. The RF power delivered by variable power supply 206 ionizes the gases. The RF power delivered by the electrode 208 causes an ion bombardment towards the grounded chuck 212 and the wafer 214. During the etching process, the plasma 210 reacts chemically with the surface of wafer 214 to remove material not covered by a photoresistive mask.

Figure 3:
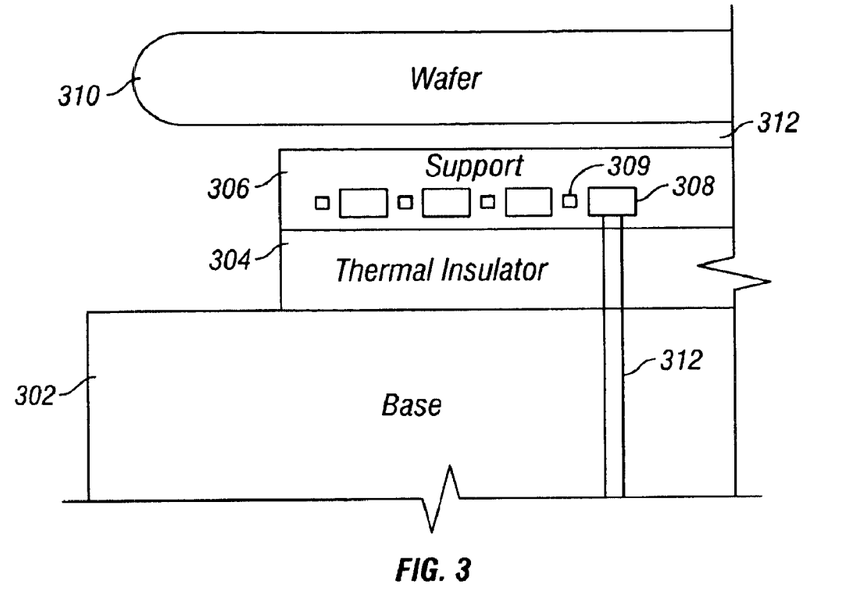
FIG. 3 is a block diagram of a chuck used to carry out the etching method in accordance with one specific embodiment of the present invention.

FIG. 3 is a schematic diagram illustrating an apparatus for controlling the temperature of a workpiece in accordance with one embodiment of the present invention. A base 302 or a heat exchanger supports a thermal insulator 304. A support 306, preferably flat, is mounted over the thermal insulator 304. A heater 308 is embedded in the support 306. A workpiece 310, such as a wafer, is disposed over the support 306. A thermal conductor 312 provides an intimate thermal contact between the support 306 and the workpiece 310. The thermal conductor 312 may be preferably a gas, such as helium. The helium pressure controls the thermal conduction between the workpiece 310 and the support 306.

According to one embodiment, the base 302 comprises a metallic material, preferably an aluminum base cold plate, that is maintained at a relatively constant temperature through a conventional heat exchange system such as a cooling/heating fluid loop. According to another embodiment, the base 302 may also comprise a non-metallic material, such as aluminum nitrate. However, the base 302 must be chilled to a greater extent than in standard operation without the heater 308. For example, the temperature of the base 302 may be 10° C. to 50° C. below the desired temperature of the workpiece 310. The base 302 also provides a thermal sink for plasma heating. An external coolant chiller (not shown) may be used to maintain the temperature of the baseplate. Preferably, the amount of heat removed by the external coolant chiller and the temperature of the coolant may be limited to less than 2000 W and −20° C., respectively. The base 302 further has several holes or cavities (not shown) through which heater power lines 312 or other service lines are disposed. Such service lines may comprise power lines for the heater, sensors, high voltage electrostatic clamping. Those of ordinary skills in the art will recognize that the service lines are not limited to the ones previously cited.

According to one embodiment, the thermal insulator 304 acts as significant thermal impedance break between the support 306 and the base 302. The thermal insulator 304 may comprise a thick RTV bonding adhesive layer made of polymer, plastic, or ceramic. However, the thermal impedance break of the thermal insulator 304 cannot be too excessive otherwise the wafer 310 will be insufficiently cooled. For example, the thermal insulator preferably has a thermal conductivity of a range of about 0.05 W/mK to about 0.20 W/mK. The thermal insulator 304 in this case both acts as a thermal resistive element and a bond between the support 306 and the base 302. Furthermore, the thermal insulator 304 must be such that adequate RF coupling between the plasma and the base 304 is maintained. Also, the thermal insulator 304 must tolerate significant thermal-mechanical shear due to different materials and temperatures located above and below the layer. Preferably, the thickness of the thermal insulator 304 should be less than 2 mm. Thermal insulator 304 may further incorporate several cavities or vias (not shown) contiguous to the cavities of the base 304 for housing parts of the heater power lines 312 and other service lines.

According to one embodiment, the support 306 comprises a ceramic material. The ceramic may be a non-electrically conductive material, such as for example alumina. The shape of the support 306 may preferably include a conventional disk commonly used in plasma etching systems. The support 306 may be a conventional electrostatic chuck or may be a ceramic having a mechanical clamp for holding down the wafer 310. According to one embodiment, the thickness of the support 306 is about 2 mm. However, one of skills in the art will recognize that other thicknesses may also be suitable. According to another embodiment, the support 306 construction is of a "thin disk bonded to a base" type, otherwise the lateral conduction may be so high that the heater input will be spread laterally resulting in an ineffective zone separation. The support should allow the heat to dissipate locally.

The heater 308 comprises at least one resistive element. According to one embodiment, the heater 308 may be embedded in the support 306 below the clamp electrode plane and be shaped in any desirable pattern, for example, symmetrical or arbitrary. The heater 308 may also have one or more planar heating elements. Each heating element defines a heating zone or region that may be controlled independently. The multi-zone pattern has one or more planar heating elements acting in opposition to the conduction cooling to the support 306. A sensor 309 associated with each heating zone may measure the temperature for each heating zone and send a signal to a controller or computer system, such as controller 134 of FIG. 1 or controller 218 of FIG. 2, to monitor and control each individual planar heating element. For example, a sensor such as an infrared emission sensor or thermo-couple sensor can be mounted either through ports to read directly from the workpiece 310. The sensors 309 can also be mounted within or to the back of the support 306. The heater 308 may be powered by power lines 312 disposed through openings in the thermal insulator 304 and the base 302.

According to one embodiment, heater 308 comprises an inductive heater. According to another embodiment, heater 308 comprises a heating lamp, such as krypton or quartz lamp. According to yet another embodiment, heater 308 comprises thermoelectric modules that can cool or heat. With thermoelectric modules, a base and a thermal break may be optional. Heater 308 may also comprise resistive heating elements. One of ordinary skills in the art will recognize that many other ways exists to heat support 306.

Figure 4A:
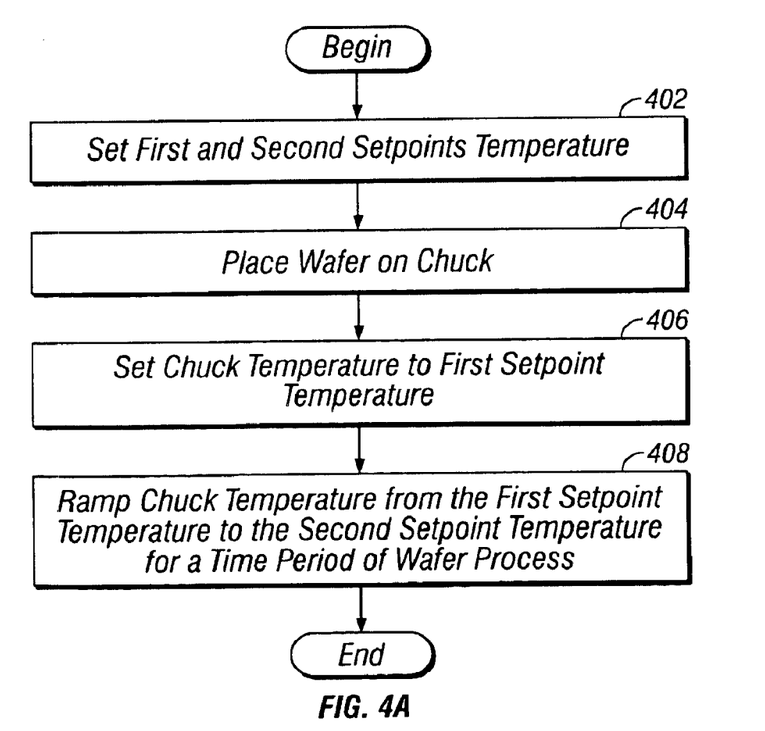
FIG. 4A is a flow diagram illustrating a method for etching a wafer in accordance with one specific embodiment of the present invention.

FIG. 4A is a flow diagram illustrating a method for etching a wafer in accordance with one specific embodiment of the present invention. A method allows etching of a wafer within an etch processor. The etch processor may include a chuck for holding a wafer and a temperature sensor reporting a temperature of the chuck. The chuck is in intimate thermal contact with the wafer. The chuck may include a heater controlled by a temperature control system. The temperature sensor may be operatively coupled to the temperature control system to maintain the temperature of the chuck at a selectable setpoint temperature. At 402, a first setpoint temperature and a second setpoint temperature are selected. At 404, a wafer is placed on the chuck. At 406, the temperature of the chuck is set to the first setpoint temperature. This is accomplished by either cooling or heating the chuck to the first setpoint temperature.

At 408, the temperature of the chuck ramps from the first setpoint temperature to the second setpoint temperature during a time period of the wafer process. In accordance with one specific embodiment of the present invention, the process may be accomplished in an incremental manner in which the temperature of the chuck incrementally increases or decreases from the first setpoint temperature to the second setpoint temperature from a time period of the wafer process. That is while the wafer is being processed, the temperature of the chuck ramps up or down. The above process may be generalized to using several different setpoint temperatures to manipulate the temperature of the chuck and wafer over a period of time during the process of the wafer, resulting in more than one temperature profile.

The heating or cooling of the chuck may also be accomplished, for example, using embedded heaters in the chuck or changing the helium pressure between the wafer and the chuck.

Figure 4B:
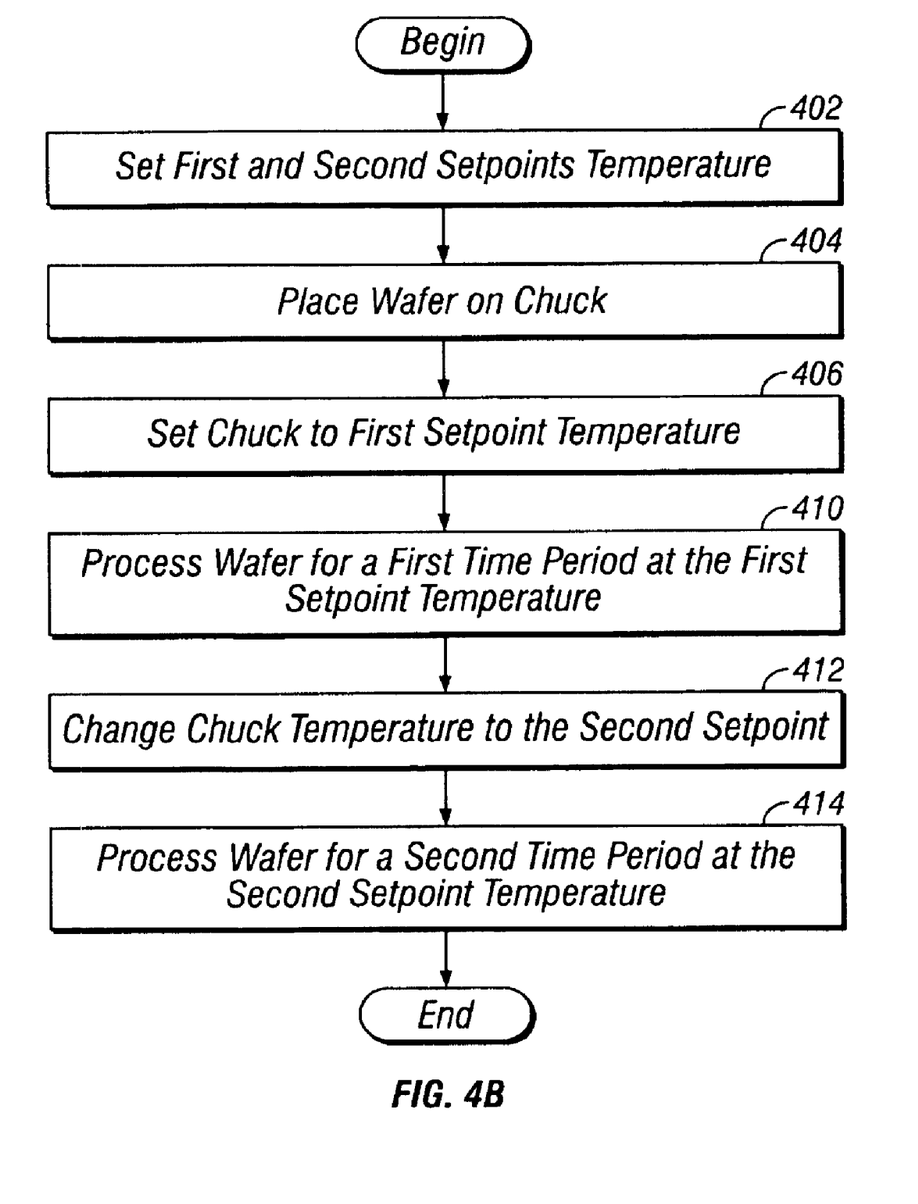
FIG. 4B is a flow diagram illustrating a method for etching a wafer in accordance with another specific embodiment of the present invention.

FIG. 4B is a flow diagram illustrating a method for etching a wafer in accordance with another specific embodiment of the present invention. At 402, a first setpoint temperature and a second setpoint temperature are selected. At 404, a wafer is placed on the chuck. At 406, the temperature of the chuck is set to the first setpoint temperature. At 410, the wafer is then processed for a first time period at the first setpoint temperature. At 412, after the end of the first time period, the temperature of the chuck is modified to the second setpoint temperature. In accordance with another specific embodiment of the present invention, the etching plasma reactor may be turned off to allow for the temperature to drop in between plasma steps. At 414, the wafer is subsequently processed for a second period of time at the second setpoint temperature.

The above process may be generalized to using several different setpoint temperatures to manipulate the temperature of the chuck and the wafer, resulting in more than one temperature profile. The temperature of the chuck may thus increase or decrease according to the setpoint temperatures.

Figure 4C:
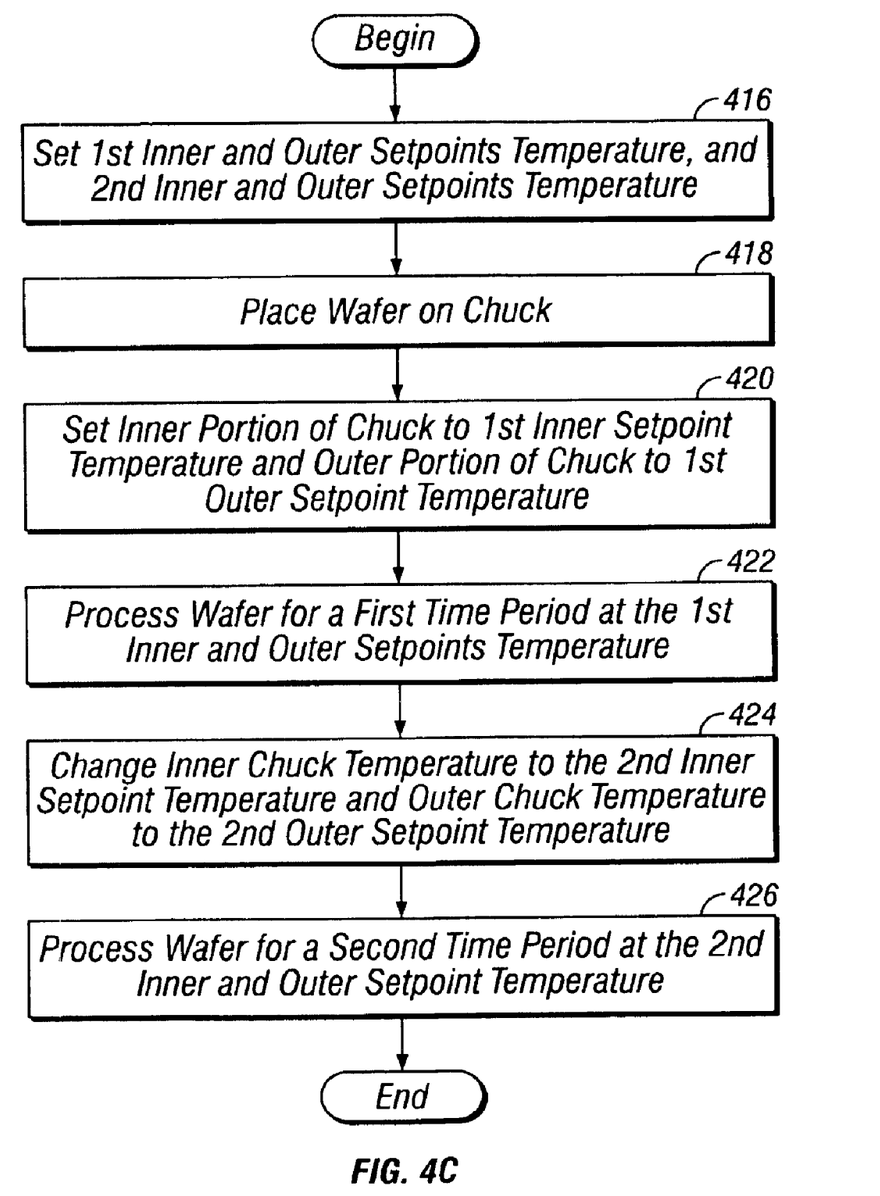
FIG. 4C is a flow diagram illustrating a method for etching a wafer in accordance with yet another specific embodiment of the present invention.

FIG. 4C is a flow diagram illustrating a method for etching a wafer in accordance with yet another specific embodiment of the present invention. The Electrostatic Chuck (ESC) may be divided into different thermal zones. For example, a heater embedded in the chuck may consists of a first heater component for heating the inner portion of the chuck, and a second heater component for heating the outer portion of the chuck. At 416, different setpoint temperatures may be set. The different setpoint temperatures may comprise a first inner and outer setpoint temperatures and a second inner and outer temperatures. At 418, a wafer to be etched is placed on the ESC. At 420, the temperature of the inner portion of the chuck is set to the first inner setpoint temperature and the temperature of the outer portion of the chuck is heated to the first outer setpoint temperature. At 422, the wafer is processed for a first period of time at the first inner and outer setpoint temperature. At 424, the temperature of the inner portion of the chuck is then modified to the second inner setpoint temperature and the temperature of the outer portion of the chuck is then modified to the second outer setpoint temperature. At 426, the wafer is then processed for a second time period at the second inner and outer setpoint temperature.

The above process may be generalized to using several different inner and outer setpoint temperatures to manipulate the temperature of the chuck and the wafer, resulting in more than one temperature profile. The temperature of the chuck may thus increase or decrease according to the different inner and outer setpoint temperatures.

Figure 5:
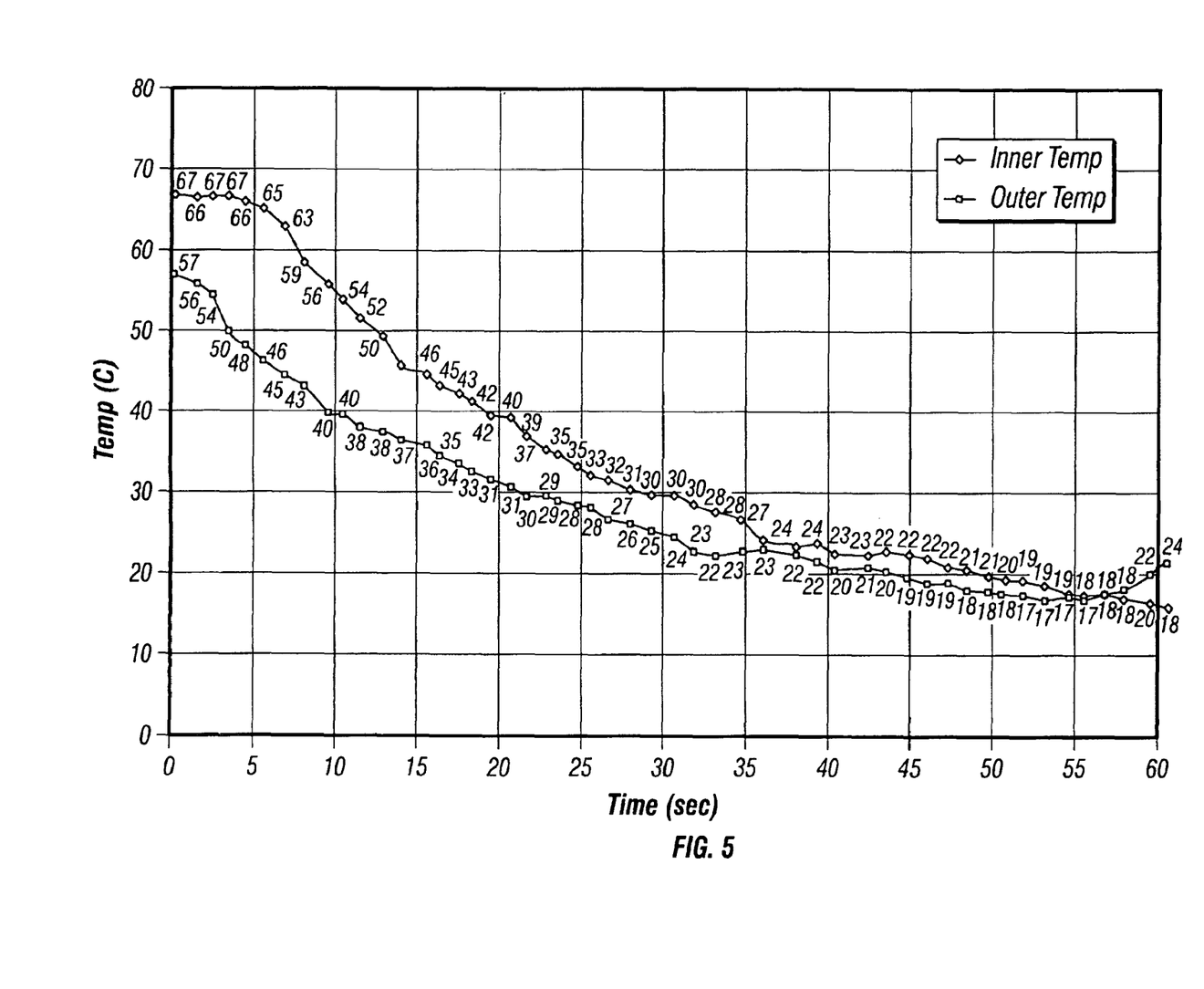
FIG. 5 is a graph of a temperature change of a wafer during an etching process in accordance with one specific embodiment of the present invention.
Figure 6A:
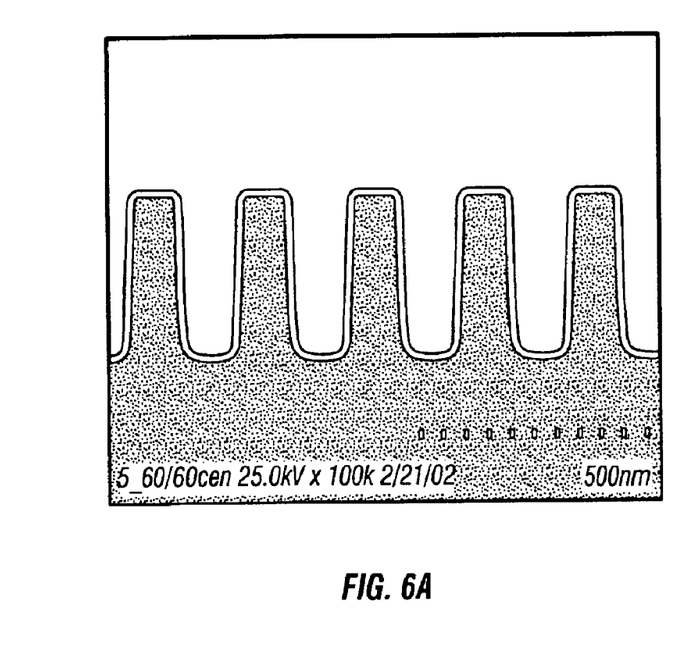
FIG. 6A is a cross-sectional diagram of a conventional trench in an etched wafer.
Figure 6B:
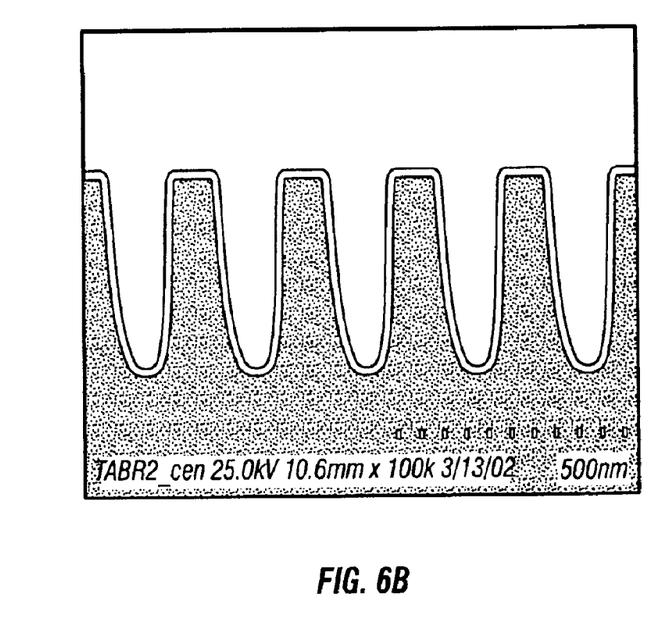
FIG. 6B is a cross-sectional diagram of a trench in a wafer etched in accordance with one specific embodiment of the present invention.

FIG. 5 is a graph of a temperature change of a wafer during an etching process in accordance with one specific embodiment of the present invention. This example illustrates the temperature change of the chuck during an etching process. In this particular scenario, the temperature is decreased during the etching process to increase the profile rounding at a trench bottom. Using a tunable ESC, the chuck temperature in both heating zones could be ramped equally or separately to a single or dual target temperature. The etching process started with a high temperature then over a series of steps, the temperature of the chuck is incrementally dropped until the desired STI depth is reached. For illustration purposes, FIG. 6A is a cross-sectional diagram of a conventional trench in a wafer conventionally etched. In contrast, FIG. 6B is a cross-sectional diagram of a trench in a wafer etched in accordance with one specific embodiment of the present invention.

The present invention may be used to increase profile rounding at a trench bottom by changing the temperature of an Electrostatic Chuck (ESC) during trench etching. Using a tunable ESC, the chuck temperature in both heating zones could be ramped equally or separately to a single or dual target temperature. Achieving desired STI profile or bottom rounding can sometimes be difficult. Secondly each customers wafer have a different exposed area which prevents the transfer of a successful STI and/or profile rounding recipe from one wafer type to another. Previous bottom-rounding recipes have limited success and sometimes create profile discontinuities. Also these past bottom-rounding recipes could not perform profile rounding. Profile rounding is where the trench begins to round (curve inward) well before the trench bottom. A successful profile rounding will have a smooth transition from top (straight profile section) to bottom showing constant increasing curvature with no profile discontinuities or corners at the trench bottom.

In accordance with one specific embodiment of the present invention, the presently disclosed process may also be implemented using a tunable ESC etching apparatus. With most all STI chemistries, reducing the chuck temperature increases the profile taper on both dense an iso-trenches. Lower temperatures increase the surface-sticking coefficient, which increases sidewall redeposition. Ramping the chuck temperature down during trench process (i.e. plasma on) will continuously increase the profile taper during the trench etch by continuously increasing the sidewall redeposition. The range of temperature used may vary considerably. In accordance with another specific embodiment of the present invention, the tunable ESC may also allow the inner and outer temperature zones of the ESC to be ramped independently at different temperatures to adjust and improve wafer center to wafer edge depth and or profile uniformity. The bottom profile as well as the corners is also rounded by modifying the ESC temperature.

In accordance with another embodiment of the present invention, the present invention allows control of the profile (oxide and photoresist) of advanced semiconductor features through the dynamic control of substrate temperature during dry etch processing of materials. The wafer temperature controls the surface reactions occurring on the microscopic feature and regulates the diffusion of species along the surface, the absorption/desorption characteristics of the surface species, and the rate of chemical reactions on the surface. Through these mechanisms the microscopic dimensions of the feature can be tuned during a single process step by varying the wafer temperature. Oxide profile characteristics that can be tuned using temperature include bow and striations and oxide etch rate. Photoresist profile characteristics that can be tuned include resist faceting and deposition uniformity.

Examples of relevant applications include high aspect ratio contact (HARC) etch and self aligned contact (SAC) etch. The present invention may be implemented using for example both traditional 248 nm resist and new 193 nm resist, which is more sensitive to etch chemistries and therefore more likely to allow the formation of striations. For optimal profile control and minimization if incomplete etch, the HARC etch may need high temperature during the first part of an etch process and low temperature during the second part. The high temperature serves to eliminate bow and striations in the HARC etch by increasing polymer mobility on the surface of the wafer. The SAC etch requires the opposite temperature scheme with low temperature during the first part of the etch for high oxide etch rates and high temperature during the second for optimal silicon nitride selectivity.

For illustration purposes, the following is an example of a method for controlling a contact profile by varying the wafer temperature during the etching process in a capacitively coupled, dual frequency plasma etcher. For 200 mm applications, a total power of 3000 W and a process pressure of 50 mT may be used. The total gas may flow between 100 and 600 sccm.

High Aspect Ratio Contacts (HARC):

For optimal profile control and minimization of incomplete etch, the HARC etch can be carried out at high temperature during the first part of the etch and low temperature during the second part. The high temperature serves to minimize bow and striations in the HARC etch by increasing polymer mobility on the surface of the wafer and/or decreasing the sticking coefficient of reactive species. The time duration of the high temperature portion of the etch may be long enough that a depth greater than the maximum bow depth (usually less than 1 $\mu$m) is reached. For example, a typical HARC process chemistry used to etch 0.18 $\mu$m features to a depth of 2.5 $\mu$m, may be as follows:

50 mT/1200 (2)/1800 (27)/300 Ar/15 C4F8/8 O2/0C LE/20 T He/270s

For many dielectric films, this process may create an undesired bow in the profile about 5000 A to 7000 A below the top surface of the contact. To minimize the bow, the etch may be carried out in two steps, one at high temperature and one at low temperature. The high temperature could be achieved by lowering the He pressure and then the two-step process may be as follows:

50 mT/1200 (2)/1800 (27)/300 Ar/15 C4F8/8 O2/0C LE/10 T He/200s 50 mT/1200 (2)/1800 (27)/300 Ar/15 C4F8/8 O2/0C LE/20 T He/70s

The second step of the process may run at lower temperature to avoid etch stop deep in the contact hole. By raising the wafer temperature by 20 C, the bow has been reduced from about 40% of the original contact dimension to less than 5% of the original contact dimension.

Self-Aligned Contact (SAC):

The SAC etch requires the opposite temperature scheme of the HARC etch, specifically with low temperature during the first part of the etch for high oxide etch rates and high temperature during the second for optimal silicon nitride selectivity. This approach takes advantage of the fact that silicon nitride etches slower at high temperature.

One SAC process may be as follows:

60 mT/1500 (2)/1500 (27)/300 Ar/16 C4F6/12 O2/0C LE/8 T He/110s

The 8 Torr of He pressure creates a relatively hot wafer and good nitride selectivity, but leaves oxide residues at the bottom of the contact hole. If the opposite approach is used and the etch is carried out at lower temperatures, the oxide may be completely etched, but the nitride selectivity may be poor. Using a two-step approach, such as 60 mT/1500 (2)/1500 (27)/300 Ar/16 C4F6/12 O2/0C LE/20 T He/50s 60 mT/1500 (2)/1500 (27)/300 Ar/16 C4F6/12 O2/0C LE/8 T He/60s the oxide residue will be completely etched and good nitride selectivity will be maintained. If the entire wafer is etched at 20 Torr He, nitride selectivity is degraded by a factor of three. The nitride etch rate is reduced by about 60% by using 30 C hotter temperature during the second step of the etch.

There was no practice of changing the temperature from ARC open to metal stack, for example, or to adjust the wafer temperature within a single chamber from one lot to the next when the open area changes. Usually, dedicated chambers operating at different temperatures were employed. It is impractical to use dedicated chambers operating at different temperatures for each layer in a stack because of reduction in throughput and the concomitant increase in cost of ownership. But changing temperature layer by layer enables the achievement of profiles and selectivity that simply cannot be achieved by any other means. By not having to dedicate chambers for each temperature, the semiconductor manufacturer gains flexibility in capital utilization and can rapidly adjust for changing product mix through the fabrication. This leads to cost savings as potentially fewer machines are required as all machines can be used for any open area or for any other change in the device layout that would require dedicated chambers working at different temperatures.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for etching a wafer within an etch processor, the etch processor including a chuck for holding a wafer and a plurality of temperature sensors reporting at least a temperature of the wafer at an inner region and an outer region, the chuck including a first heater heating the inner region and a second heater heating the outer region, the first and second heaters controlled by a temperature control system, and the plurality of temperature sensors operatively coupled to the temperature control system to maintain the temperature of the chuck at a selectable setpoint temperature, the method comprising:

selecting a first inner setpoint temperature and a first outer setpoint temperature, a second inner setpoint temperature and a second outer setpoint temperature;

placing the wafer on the chuck;

heating the inner region of the chuck to said first inner setpoint temperature and the outer region of the chuck to said first outer setpoint temperature; and ramping the temperature of the chuck from said first inner setpoint temperature to said second inner setpoint temperature and from said first outer setpoint temperature to said second outer setpoint temperature while processing the wafer for a period of time.

2. The method of claim 1 wherein said first inner and outer setpoint temperatures are respectively greater than said second inner and outer setpoint temperatures.

3. The method of claim 1 wherein said first inner and outer setpoint temperatures are respectively less than said second inner and outer setpoint temperatures.

4. The method of claim 1 wherein said chuck comprises a plurality of thermal zones.

5. The method of claim 1 wherein said ramping further comprises:

heating the inner region of the wafer to said second inner setpoint temperature; and heating the outer region of the wafer to said second outer setpoint temperature.

6. The method of claim 1 wherein said ramping further comprises: cooling the inner region of the wafer to said second inner setpoint temperature; and cooling the outer region of the wafer to said second outer setpoint temperature.

7. The method of claim 1 further comprising:

controlling a profile of a wafer with said selecting said first inner and outer setpoint temperatures and said second inner and outer setpoint temperatures.

8. The method of claim 1 further comprising:

controlling a taper of a trench in the wafer with said selecting said first inner and outer setpoint temperatures and said second inner and outer setpoint temperatures.

9. The method of claim 1 further comprising:

controlling a rounding of a top and bottom trench of a wafer with said selecting said first inner and outer setpoint temperatures and said second inner and outer setpoint temperatures.

10. The method of claim 1 further comprising:

controlling a bow of a trench in the wafer with said selecting said first inner and outer setpoint temperatures and said second inner and outer setpoint temperatures.

11. The method of claim 1 further comprising:

controlling a striation of a trench in the wafer with said selecting said first inner and outer setpoint temperatures and said second inner and outer setpoint temperatures.

12. The method of claim 1 further comprising:

controlling a facet of a trench in the wafer with said selecting said first inner and outer setpoint temperatures and said inner and outer second setpoint temperatures.

13. The method of claim 1 further comprising:

controlling a critical dimension of the wafer with said selecting said first inner and outer setpoint temperatures and said second inner and outer setpoint temperatures.

14. A method for etching a wafer within an etch processor, the etch processor including a chuck for holding a wafer and a plurality of temperature sensors reporting at least a temperature of the wafer at an inner region and an outer region of the wafer, the chuck including a first heater and a second heater heating respectively the inner region and the outer region, the first and second heaters controlled by a temperature control system, and the plurality of temperature sensors operatively coupled to the temperature control system to maintain the temperature of the chuck at a selectable setpoint temperature, the method comprising:

selecting a first inner setpoint temperature and a first outer setpoint temperature;

selecting a second inner setpoint temperature and a second outer setpoint temperature;

placing the wafer on the chuck;

heating the inner region of the wafer to said first inner setpoint temperature and the outer region of the wafer to said first outer setpoint temperature;

processing the wafer for a first period of time at said first inner and outer setpoint temperatures;

changing the temperature of the wafer to the second inner and outer setpoint temperatures; and processing the wafer for a second period of time at said second inner and outer setpoint temperatures.

15. The method of claim 14 further comprising:

allowing the wafer to cool down between said processing.

16. The method of claim 14 further comprising:

allowing the wafer to heat between said processing.

17. The method of claim 14 wherein said first inner and outer setpoint temperatures are respectively less than said second inner and outer setpoint temperatures.

18. The method of claim 14 wherein said first inner and outer setpoint temperatures are greater than said second inner and outer setpoint temperatures.

19. The method of claim 14 wherein said chuck comprises a plurality of thermal zones.

20. The method of claim 14 further comprising:

controlling a profile of a wafer with said selecting said first inner and outer setpoint temperatures and said second inner and outer setpoint temperatures.

21. The method of claim 14 further comprising:

controlling a taper of a trench in the wafer with said selecting said first inner and outer setpoint temperatures and said second inner and outer setpoint temperatures.

22. The method of claim 14 further comprising:

controlling a bow of a trench in the wafer with said selecting said first inner and outer setpoint temperatures and said second inner and outer setpoint temperatures.

23. The method of claim 14 further comprising:

controlling a striation of a trench in the wafer with said selecting said first inner and outer setpoint temperatures and said second inner and outer setpoint temperatures.

24. The method of claim 14 further comprising:

controlling a facet of a trench in the wafer with said selecting said first inner and outer setpoint temperatures and said second inner and outer setpoint temperatures.

25. The method of claim 14 further comprising:

controlling a critical dimension of the wafer with said selecting said first inner and outer setpoint temperatures and said second inner and outer setpoint temperatures.

26. A method for etching a wafer comprising:

selecting a first inner setpoint temperature and a first outer setpoint temperature, and a second inner setpoint temperature and a second outer setpoint temperature;

holding a wafer against a top face of a chuck during processing;

configuring said top face into a plurality of zones into which zone coolant gas can flow along and between the top face and an underside of said wafer;

admitting a cooling gas into the respective zones; and controlling the pressures of zone coolant gas separately in the respective zones so as to control the temperature to said first inner and outer setpoint temperatures for a first period of time, and to said second inner and outer setpoint temperatures for a second period of time, across said wafer during processing.

* * * * *